United States Patent
Groves et al.

[11] Patent Number: 5,981,962
[45] Date of Patent: Nov. 9, 1999

[54] DISTRIBUTED DIRECT WRITE LITHOGRAPHY SYSTEM USING MULTIPLE VARIABLE SHAPED ELECTRON BEAMS

[75] Inventors: Timothy R. Groves, Poughkeepsie, N.Y.; Rodney A. Kendall, Ridgefield, Conn.

[73] Assignee: International Business Machines Corporation, Armonk, N.Y.

[21] Appl. No.: 09/004,814

[22] Filed: Jan. 9, 1998

[51] Int. Cl.[6] ............................................. H01J 37/302
[52] U.S. Cl. ........................... 250/492.23; 250/398
[58] Field of Search ..................... 250/492.2, 492.23, 250/398, 423 F

[56] References Cited

U.S. PATENT DOCUMENTS

| | | | |
|---|---|---|---|
| 4,742,234 | 5/1988 | Feldman et al. | 250/398 |
| 4,820,927 | 4/1989 | Langner et al. | 250/423 R |
| 5,260,579 | 11/1993 | Yasuda et al. | 250/398 |
| 5,363,021 | 11/1994 | MacDonald | 250/398 |
| 5,384,463 | 1/1995 | Honjo et al. | 250/398 |
| 5,528,048 | 6/1996 | Oae et al. | 250/492.22 |
| 5,528,512 | 6/1996 | Moriyama | 250/492.23 |
| 5,689,117 | 11/1997 | Nakasuji | 250/398 |
| 5,723,867 | 3/1998 | Imura | 250/423 F |
| 5,742,062 | 4/1998 | Stengl et al. | 250/396 R |
| 5,834,783 | 11/1998 | Muraki et al. | 250/398 |

*Primary Examiner*—Bruce C. Anderson

[57] ABSTRACT

A multiple beam direct write e-beam system employs a set of miniature beam writing modules acting in parallel, each of which employs the combination of a uniform magnetic field and a uniform parallel electric field to form an image of a low-brightness electron emitting surface and also to modify the shape of an initially square beam, thereby producing a set of separately and independently modified beams; the modified beams are deflected in parallel by the same magnetic field and a uniform transverse electric field to cover a desired area; emitters, beamshaping deflection electrodes and fine-deflection electrodes are formed by microlithographic techniques.

38 Claims, 9 Drawing Sheets

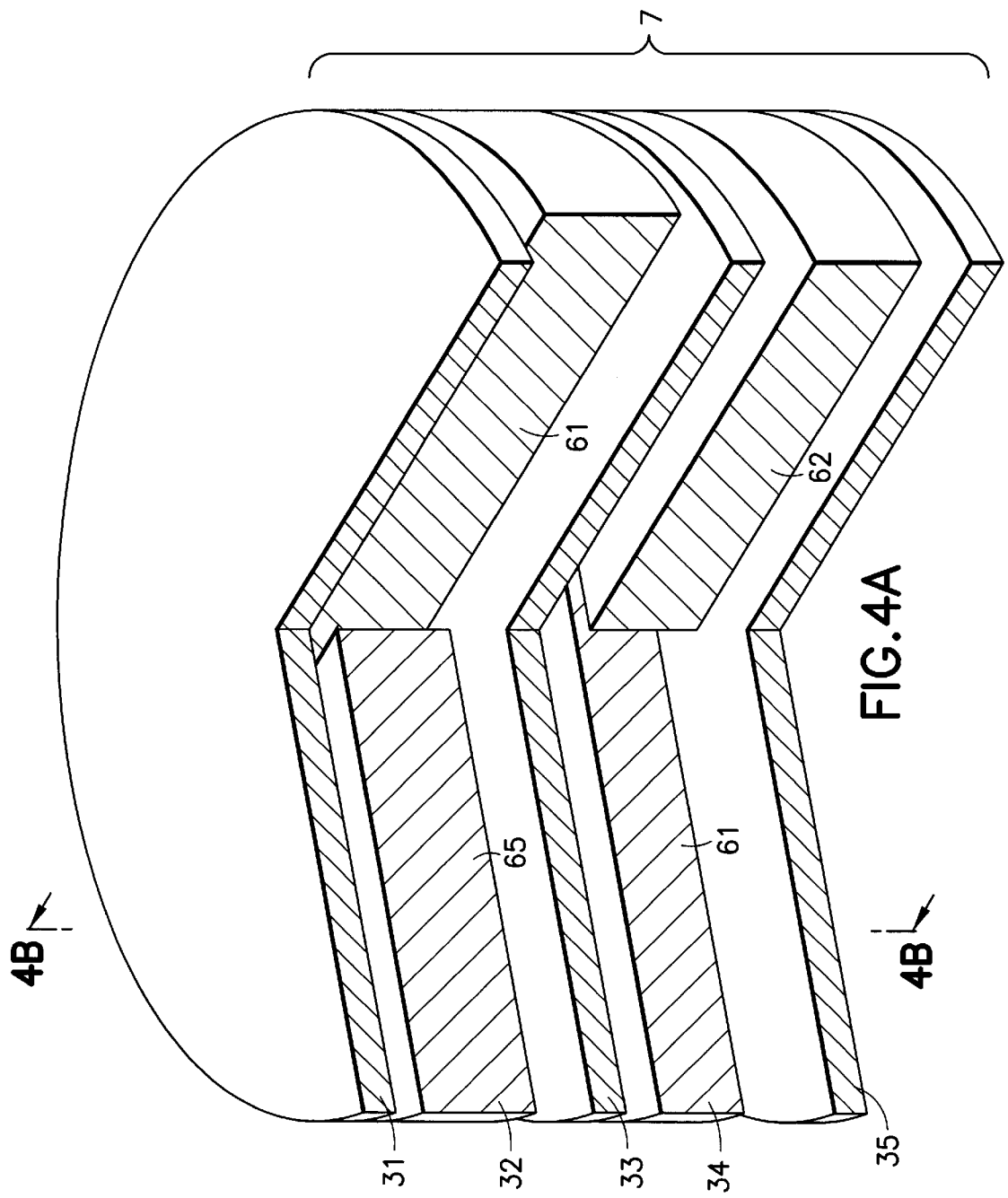

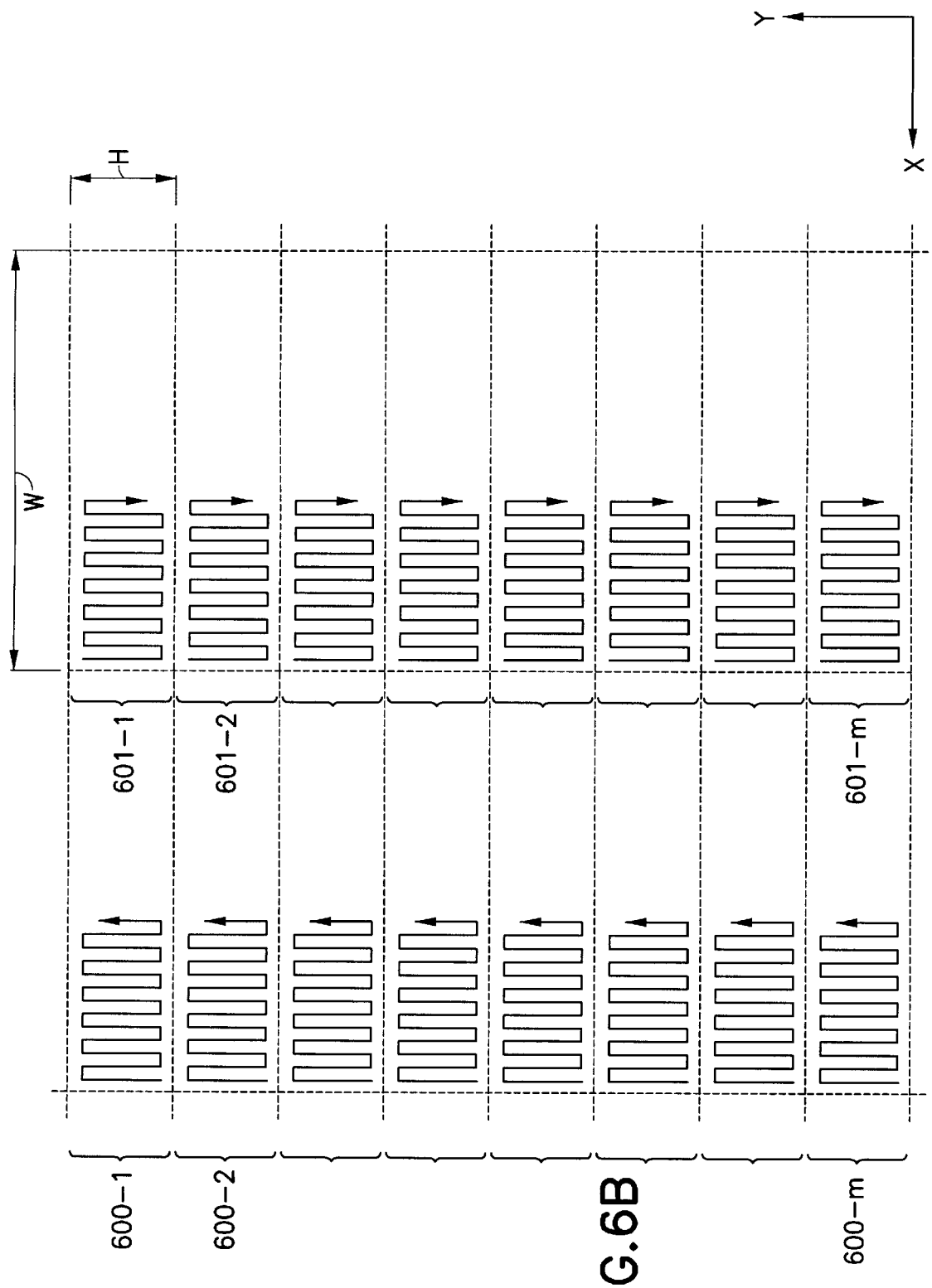

DISTRIBUTED DIRECT WRITE LITHOGRAPHY SYSTEM USING MULTIPLE VARIABLE SHAPED ELECTRON BEAMS

CROSS-REFERENCE TO RELATED PATENT APPLICATIONS

This Patent Application is related to U.S. patent application Ser. No. 09/004,815, entitled "MULTIPLE VARIABLE SHAPED ELECTRON BEAM SYSTEM WITH LITHOGRAPHIC STRUCTURE", filed on Jan. 9, 1998, and U.S. patent application Ser. No. 09/004,816, entitled "METHOD FOR WRITING A PATTERN USING MULTIPLE VARIABLE SHAPED ELECTRON BEAMS", filed on Jan. 9, 1998, both of which are presently assigned to the assignee of the instant application, and the disclosures of which are incorporated herein by reference.

FIELD OF THE INVENTION

The field of the invention is integrated circuit lithography, in particular, a multi-beam system for writing a pattern on a wafer directly without the use of a mask or reticle.

BACKGROUND OF THE INVENTION

Producing integrated circuit patterns on a wafer is technically demanding in two respects: first, integrated circuits contain a large amount of pattern information, with up to $2\times10^{10}$ pattern features on a given process level of the chip. Second, the minimum feature size continues to shrink by a factor of two every six years, with 130 nm features expected in full scale manufacturing by the year 2003. These requirements place ever increasing demands on both the speed and spatial resolution of the lithographic process by which patterns are created on the chip.

Present day lithography is typically performed by first creating the pattern on a transparent reticle, then optically projecting this pattern onto the wafer using ultraviolet light. This projection process is repeated multiple times, once for each chip on the wafer. The spatial fidelity of the pattern on the chip is limited by the ability of the optical projection system to resolve the features, due to diffraction. This limitation, which occurs even in the case of a hypothetical perfect reticle, is severe with light optics. In addition, reticle patterns inevitably have imperfections, which also limit pattern fidelity on the wafer. Moreover, fabrication of the reticle is time consuming and expensive.

A well known solution is to use a focussed electron beam (e-beam) to write the pattern directly on the wafer. The diffraction limited resolution of an electron beam is, for this purpose, unlimited, owing to the fact that the wavelength of fast electrons is roughly a factor of $10^4$ smaller than ultraviolet light. In addition the need for a patterned reticle is eliminated, as the pattern is stored in computer memory, from which it is transferred directly to the wafer, without the need for projection.

Unfortunately, existing approaches to direct write e-beam, as it is called, are too slow to be practical for large scale manufacturing. The writing speed, measured in units of area swept out per unit time, is equal to the ratio of the total writing current to the dose measured in units of charge per unit area. The writing current needed to obtain minimally acceptable writing speed is of the order of 100 $\mu$A. This corresponds to a writing speed of 10 cm$^2$/sec at a dose of 10 $\mu$C/cm$^2$.

Existing e-beam systems are not capable of delivering this minimum current. The reason is that, as the current is increased, the Coulomb interaction between beam electrons occurring in the beam path causes the image to blur, amounting to a loss of resolution. Coulomb interaction arises from the fact that the electrons are discrete charged particles, randomly distributed within the beam. The electrons thus exert a repulsive force on one another, which is random in magnitude and direction. The amount of blurring depends on the current density throughout the entire optical path. This in turn depends intimately on the optical design configuration of the system.

Systems with narrow beams illuminating a limited area or field, are called "probe-forming" systems. Because the beam is narrow, the electrons remain in close proximity to one another throughout the duration of their flight. The strength of the Coulomb interaction is inversely proportional to the square of the interelectron separation. In probe forming systems the separation is small, and the Coulomb interaction strong, thus limiting the usable writing current. The current in a typical probe forming system is on the order of 0.5 $\mu$A, for which the blurring is 50 nm. This resolution is marginally acceptable for printing 180 nm wide lines, but the writing speed is at least a factor of 200 too slow.

A potential solution is to spread the writing current over a larger volume, thus reducing the Coulomb blurring. An example is electron projection printing, in which an electron optical image of a reticle can be used to write a large pattern area in a single flash. This is undesirable, however, for two reasons: first, it requires a patterned reticle. Second, all of the writing current is constrained to pass through a single, small aperture, which is needed to produce contrast in the image. Because of this constriction, electron projection suffers from Coulomb blurring as with other probe forming systems, though to a lesser extent.

In contrast to probe forming systems, a system in which the current is spread out over a large volume throughout the optical path may be termed "distributed". One way to construct such a system is by the use of multiple beams. The total writing current is given by the number of beams times the current in each beam. If the number of beams is large enough, the current in each beam may be made sufficiently low that Coulomb blurring does not impair the resolution.

The essential elements of such a system include, for each beam, an electron source, a lens, a means for positioning the beam relative to the writing surface, and a means for determining the numerical aperture (NA) of the optics. Each of these elements must be made to act identically on each beam, in a way that all beams act properly in concert, and maintain the correct relationship with one another.

Yasuda, et al. (U.S. Pat. No. 5,359,202) employ a single electron source, flooding an array of blanking apertures to produce a multiplicity of beams. The bundle of beams then passes through an optical system including a single aperture which defines the NA. As noted above, this constriction makes the system susceptible to Coulomb blurring, thereby limiting the useful current. Despite the use of multiple beams, this is not a distributed system, but a probe forming system.

J. E. Schneider, et al. (Journal of Vacuum Science and Technology, B 14(6), p. 3782 (1996)) employ a semiconductor on glass photocathode as the source for a parallel, multiple electron beam system for lithography. This system also constrains the writing current to pass through a single aperture which defines the NA. As the authors correctly point out, the useful current is limited by the Coulomb interaction to about 10 $\mu$A. This is about a factor of 10 too small to be of practical use for manufacturing.

MacDonald (U.S. Pat. No. 5,363,021) employs a massively parallel array cathode consisting of a multiplicity of individual electron sources, explicitly, field emission tips. Each beam projects a single pixel onto the writing surface. This requires the source brightness to be relatively high, in order that the total writing current be suitable for high writing speed. The functions of focussing and positioning are accomplished by a separate lens and deflector for each beam. These structures consist of microscopically small elements precisely positioned relative to one another. Care must be taken to ensure precise alignment of each beam relative to its optics, as failure to do so would result in aberrations which degrade resolution. There is no mention of how the numerical aperture (NA) is determined. It is reasonable to assume, however, that each beam has a separate beam defining aperture which determines the NA.

SUMMARY OF THE INVENTION

The invention relates to a direct-write electron beam apparatus, having a number of modules containing separately controllable miniature shaped-beam e-beam systems writing in parallel on a wafer.

A feature of the invention is the use of closely spaced beam modules having transverse dimensions on the order of 1 mm and longitudinal dimension on the order of 0.25 mm.

Another feature of the invention is that the individual beams nowhere intersect one another, thus substantially eliminating blurring and crosstalk effects.

Another feature of the invention is that the individual beam modules are positioned in an array, with the optical elements shared by all of the modules, thus substantially reducing the need for separate, microscopic components.

Another feature of the invention is the use of a uniform magnetic field parallel to the axis of a module that, in combination with an electric accelerating field, forms an image of a low-brightness emitting surface on a shaping aperture plate, from which the same uniform magnetic field, in combination with a transverse uniform electric deflection field, deflects the spot in a direction perpendicular to wafer stage motion, so that the array of modules covers the entire area to be written.

Another feature of the invention is that the numerical aperture of the system is defined by the ratio of the transverse velocity of the electrons at the emitter to the axial velocity after acceleration, thus eliminating the need for separate physical apertures to perform this function.

BRIEF DESCRIPTION OF THE DRAWINGS

FIG. 4A illustrates a view of a portion of the electrodes in the beam shaping apertures.

FIGS. 6A–6C illustrate the path traced out by the several beams in different embodiments of the invention.

DESCRIPTION OF THE PREFERRED EMBODIMENT

Figure 1:
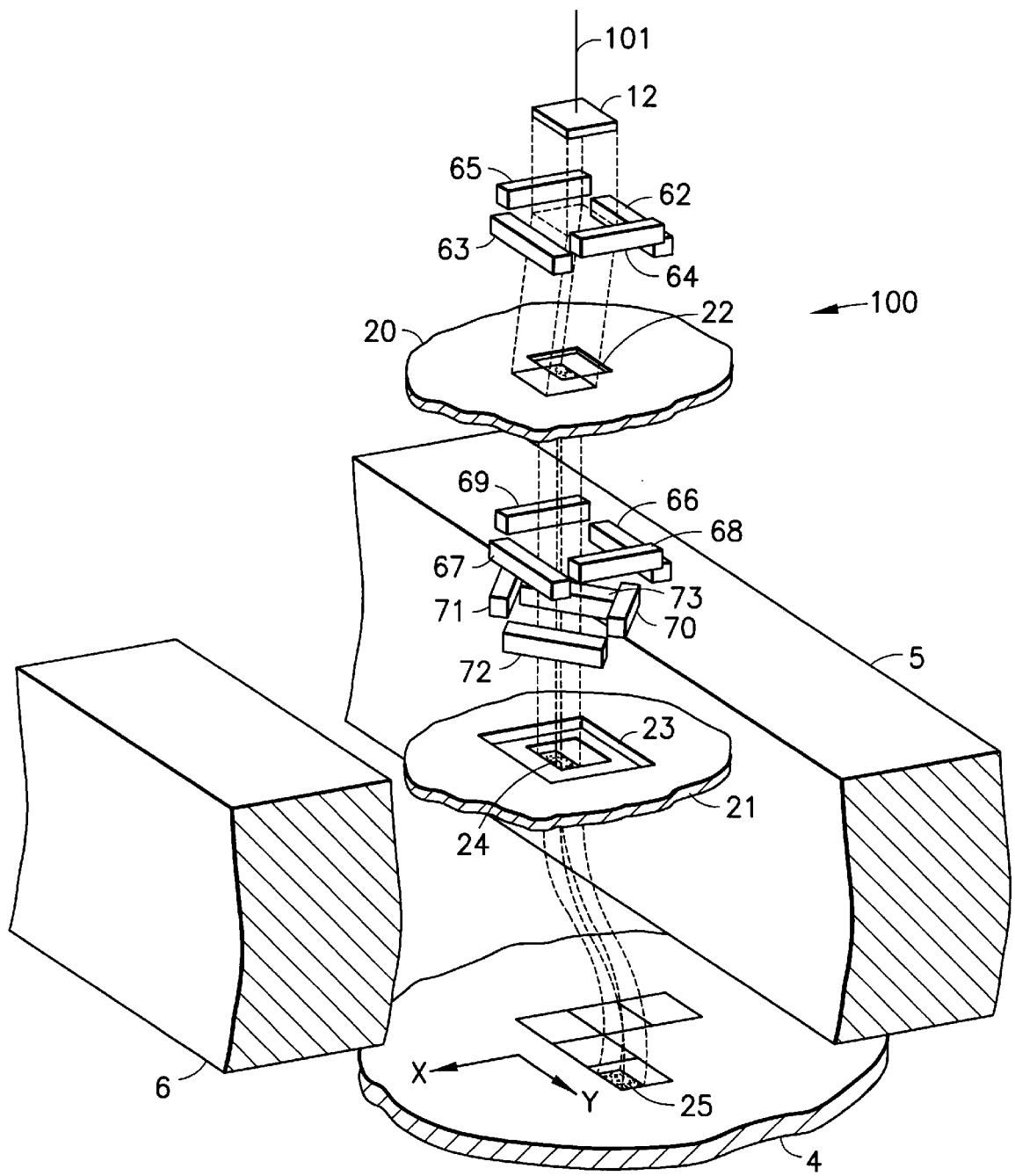
FIG. 1 illustrates a perspective view of a single module in an embodiment of the invention.

The invention relates to a system having a plurality of electron beams used to write an integrated circuit pattern directly on a wafer, without the use of a reticle. The beams form a distributed array; i.e., all beams remain spatially separated from one another throughout the entire length of the optical path. The basic structure of the apparatus consists of a series of parallel, planar electrodes, oriented perpendicular to the beam axes. The beams pass through apertures in these electrodes, and impinge on the wafer, which comprises the surface on which the pattern is written.

The electron source consists of a planar cathode, patterned with a rectilinear array of square emitting areas nominally one micron on a side, and separated by a distance typically between 0.2 mm and 1.0 mm. This cathode is patterned using conventional lithographic methods.

A planar accelerating electrode is positioned parallel with the cathode, and some distance away. The cathode array is biased at a constant negative dc potential relative to the accelerating electrode, thus providing a uniform electrostatic accelerating force vector oriented parallel with the optic axis. The entire apparatus is permeated by a constant, uniform magnetic field oriented parallel with the optic axis. The superposition of the uniform axial electrostatic and magnetic fields causes an electron optical image of the cathode to be formed at the plane of the accelerating electrode. This occurs identically and simultaneously for each beam in the array. This focussing condition requires a specific relationship between the strengths of the electrostatic and magnetic fields, and the distance from the cathode to the accelerating electrode, as detailed mathematically below.

The accelerating electrode is lithographically patterned with an array of square apertures nominally one micron on a side. Each aperture is aligned with one emitter. Each beam thus passes through its own aperture, and, by virtue of the uniform axial magnetic field, is in turn imaged onto the wafer, which is positioned parallel with the planar cathode and accelerating electrode. The net result thus far is an array of square spots focussed onto the wafer, with the precise size and spacing of the emitters. The magnification is unity, leading to 1:1 imaging of the emitters onto the wafer.

An array of deflector plates is positioned between the accelerating electrode and the wafer. These plates are oriented parallel with the beams, thus perpendicular to the wafer. The plates run the length of the apparatus, with a row of beams between each pair of neighboring plates. The plates are excited with a variable electrostatic potential, which alternates in sign for neighboring plates. This creates a uniform transverse electrostatic deflection field in the space between the plates, said field being equal in magnitude, but alternating in direction for neighboring rows of beams. The combined action of the uniform transverse electric field with the uniform axial magnetic field causes a net deflection of each beam at the wafer in a direction parallel with the deflection plates. The wafer is clamped to a mechanical stage, and moves in a direction perpendicular to the deflection. By the combined action of the deflection and mechanical motion acting in mutually perpendicular directions, full two-dimensional addressing of the wafer by the beams is accomplished. The pattern is tiled with stitched subfields, with each beam writing its own subfield.

Up to this point, all beams experience the same focussing and deflection, with the caveat that neighboring rows of beams are deflected in opposite directions. In order to incorporate pattern specific information, a planar deflector is positioned between the cathode and accelerating electrodes. This deflector is fabricated by micromechanical means, and has a hole for each beam to pass through. Deflection is applied to each beam independently, in synchronism with the stream of pattern data, and with two-dimensional addressing. This deflection translates the image of each square emitter with respect to its corresponding square aperture in the accelerating electrode. The accelerator electrode thus has the additional function of an array of shaping apertures, forming a multiplicity of variable shaped beams. Each square spot is independently shaped to a rectangular spot of variable size and aspect ratio, depending on the pattern information to be printed. By deflecting the image of the square emitter entirely onto its corresponding accelerating electrode, each beam can be independently blanked or extinguished, and does not reach the wafer. The entire deflector array is biased at a DC electrostatic potential intermediate between the cathode and accelerating electrode, chosen such that the electrostatic accelerating field is uniform in the space between the cathode, deflector, and accelerating electrodes.

The net result of this entire arrangement is to employ all beams simultaneously, each beam writing a distinct and specific piece of the overall pattern. Simplicity of fabrication is derived from the fact that all electrodes are planar, and fabricated by conventional thin film, lithographic, and micromachining techniques. Simplicity of alignment is derived from the fact that the major focussing and deflection functions are achieved by uniform magnetic and electrostatic fields. This ensures that all beams reside in an identical electromagnetic environment. Furthermore, because the fields are uniform, alignment is not critical.

A beam is characterized by its brightness, defined as the current per unit area per unit solid angle. Brightness is a conserved quantity in any optical system. This means that the brightness at the exposure plane, in this case the wafer, is the same as the brightness of the source. For a given current and solid angle of illumination, the required brightness is inversely proportional to the exposure area. This area is, in turn, proportional to the number of pixels exposed in each flash. The more pixels that are exposed in one flash, the less brightness is required from the source. In the most elementary case a single pixel is exposed by each beam in one flash. This requires a source with maximum brightness, such as a field emitter.

If multiple pixels are exposed in one flash, such as with a variable shaped beam, the required source brightness is lower than the single pixel case by a factor equal to the number of pixels per flash. In a variable shaped beam system, for example, between 16 and 256 pixels are typically exposed in one flash. This leads to a considerable reduction in required source brightness over single pixel systems.

High brightness sources are generally less stable and less long-lived than low brightness sources, because the emission properties of a high brightness source are more easily altered by external influences such as poor operating vacuum. This tends to favor systems which expose a large number of pixels per flash, as such systems generally require relatively low source brightness. A variable shaped beam is preferred over a single pixel beam, for example.

Those skilled in the art will appreciate from the discussion herein that several features are desirable, if not essential for a practical lithography system for next-generation integrated circuit fabrication:

First, the system should not require a patterned mask or reticle, as this represents a costly, time-consuming, and performance limiting step in the overall process.

Second, the system should be distributed, with no common constrictions, in order to avoid Coulomb blurring.

Third, the individual beam segments, or individual beams, should be amenable to precise optical alignment, in order that misalignment aberrations do not degrade the resolution.

Fourth, the beams should be independently controllable, and must not influence one another in any unpredictable or uncontrolled way.

Fifth, the total usable writing current should be sufficiently high that adequate writing speed, at least 10 $cm^2$/sec, is obtained with no significant degradation of resolution.

Sixth, a multi-pixel beam, such as a variable shaped beam, is preferred over a single pixel beam, because multi-pixel beams require lower source brightness.

FIG. 1 illustrates in perspective a single module 100 of a system according to the invention, in which an electron emitter 12 of approximately 1 micron square cross section emits a beam of electrons that travel generally downward in the figure under the attraction of an accelerating electric field, spiralling about a uniform magnetic field that is imposed parallel to beam axis 101 of module 100. The array of emitters 12 in the system will be referred to as the emitter array and the array of apertures 22 will be referred to as the beam shaping array of apertures. The emitters and apertures are vertically aligned and separated by a source interval along the y-axis. The apertures are formed in an array of deflector modules that extend in a beam shaping deflector region along the z-axis. The accelerating voltage between the emitters and the aperture plate generates a parallel accelerating electric field that establishes an accelerating voltage distribution along the z-axis.

For any given combination of distance from source 12 in a source plane to accelerating shaping plate 20 in a beam shaping plane, together with the accelerating voltage imposed between the source 12 and the plate 20, a unique value of magnetic field strength exists (according to equation 1 below) for which the beam is brought to a focus at plate 20, forming an electron optical image of source 12.

Deflection voltages are applied to deflector electrodes 62–65 by external bias means not shown in this figure to deflect the focussed square spot on plate 20. Depending on the amount of deflection, some or all of the beam is stopped by plate 20, with the remaining part of the beam passing through aperture 22. The transmitted beam thus has the shape of a rectangle with variable height and width, depending on the amount of deflection. This rectangular spot is imaged onto the wafer 4. The spot shaping is performed in synchronism with the stream of pattern information, which is stored in computer memory and later retrieved at the time of writing. Blanking, as required, is effected by shifting the beam so that it falls entirely on plate 20, missing aperture 22.

Deflector electrodes 66–69 in the lower portion of the module perform similarly to electrodes 62–65, but with the differing function of correcting small errors in beam position on the wafer 4. In addition, electrodes 66–69, together with electrodes 70–73, are used to correct astigmatism, which inevitably arises from small misalignment between the elements. This astigmatism correction is effected by placing an identical voltage on electrodes 66 and 67, together with an equal and opposite voltage on electrodes 68 and 69. This creates a quadrupole lens with line foci oriented along the x- and y-axes. A voltage is applied independently to electrodes 70 and 71, and an equal and opposite voltage is applied to electrodes 72 and 73. This creates a quadrupole lens with line foci oriented at 45 degrees to the x- and y-axes. By proper choice of voltages for electrodes 66–73, astigmatism of any magnitude and direction may thus be corrected, as well as imposing appropriate deflection corrections on the beam.

An intermediate image 24 of the shaped spot is formed at plate 21 by the action of the uniform magnetic field which permeates the entire apparatus. The beam passes through aperture 23, which transmits the entire shaped beam. In the drift region below plate 21, the magnetic field is still present, and forms an image 25 of the shaped spot on the wafer 4. The large deflection electrodes 5 and 6 are driven with an equal and opposite potential relative to wafer ground potential, thus creating a transverse electrostatic field oriented along the x-axis. The combined action of the vertical magnetic field (z-direction), and the horizontal electric field (x-direction) produces a net deflection parallel to the large electrodes 5 and 6 (y-direction). Electrodes 5 and 6 may be made of any non-magnetic, conductive material. Molybdenum is preferred, because it is easily cleaned by vacuum firing, can be polished to a fine surface finish, and is sufficiently rigid that dimensional stability can be maintained.

The distance in the drift space between electrodes 20 and 21 is chosen such that an image 24 of the shaped spot is formed at plate 21. The condition for this is that the z-distance between plates 20 and 21 is twice the z-distance between emitter 12 and plate 20. The distance in the drift space between plate 21 and wafer 4 is chosen identically with the distance between plates 20 and 21. This ensures that a focussed image 25 of the shaped spot is formed on wafer 4. Plate 21 and wafer 4, both held at ground potential, serve to terminate the electric field of large electrodes 5 and 6, so that the fringing fields remain well behaved, thus ensuring that no significant loss of resolution occurs with deflection.

The wafer 4 is clamped to a mechanical stage, which moves along the x-axis. It is evident that the stage motion and the y-deflection permit the coverage of all points in a strip of the wafer having a width defined by the maximum deflection of the beam and a length set by the stage. An array of these modules 100 can be set up to cover an entire chip, a strip on the wafer, or even the entire wafer.

Typical dimensions and electromagnetic requirements for a preferred embodiment are as follows:

| | | |
|---|---|---|
| Beam accelerating voltage | 50,000 | V |
| Magnetic field strength | 948 | Gauss |
| Distance, emitter 12 to aperture plate 20 | 25 | mm |
| Distance, aperture plate 20 to plate 21 | 50 | mm |
| Distance, plate 21 to wafer 4 | 50 | mm |
| Length, deflection electrodes 5 and 6, z-direction | 48 | mm |
| Center-center spacing, deflection electrodes 5 and 6 | 1.0 | mm |
| Thickness, deflection electrodes 5 and 6 | 0.50 | mm |
| Width, deflection subfield stripe | +/−0.125 | mm |
| Voltage, deflection electrodes, maximum | +/−7.8 | V |
| Center-center spacing, emitter 12 | 1.0 | mm |

It is evident from the above dimensions that FIG. 1 has its transverse scale (x- and y-axes) greatly expanded relative to its vertical scale (z-axis), for illustrative purposes. Those skilled in the art will appreciate that the foregoing parameters may be varied as circumstances require or as a result of design choices. Other things being equal, the shorter the path length between the source plane and the wafer, the better because the system will be less susceptible to stray fields and therefore more stable. A system according to the invention is inherently small, in that there is nothing to be gained by stretching out the beam path. A higher accelerating voltage is preferred, provided that the corresponding magnetic field is feasible. An appropriate upper bound for beam path length in a system according to the invention is 20 cm. Beyond such a value, susceptibility to stray fields increases, with no countervailing benefit. With a total length along the z-axis of less than 200 mm, embodiments of this invention are qualitatively different in scale from prior art e-beam systems having a total length of about 2 m.

The formula for the distance z between object and image planes is given for each section by equation 1 (MKSC units assumed).

$$z = \frac{2\pi}{B}\sqrt{\frac{2mV_0}{e}} + \frac{2\pi^2 mE_a}{eB^2} \quad (1)$$

where $E_a$ is the accelerating field along axis 101, $eV_0$ is the kinetic energy at the object plane prior to acceleration, B is the magnetic field strength, e is the particle charge, and m is the particle mass. The first term on the right hand side applies in the drift spaces where $E_a=0$. The second term applies in the acceleration region where $V_0=0$. The magnification is unity. As is shown in the reference, the spherical and chromatic aberration coefficients are both equal to z/2, where z is the axial distance between object and image. The net deflection d at the end of the deflection drift space is given by equation 2

$$d = \frac{E_d z^2}{4\pi V} \quad (2)$$

where $E_d$ is the uniform deflection field strength and eV is the kinetic energy at plate 21 (and at the wafer).

Figure 2:
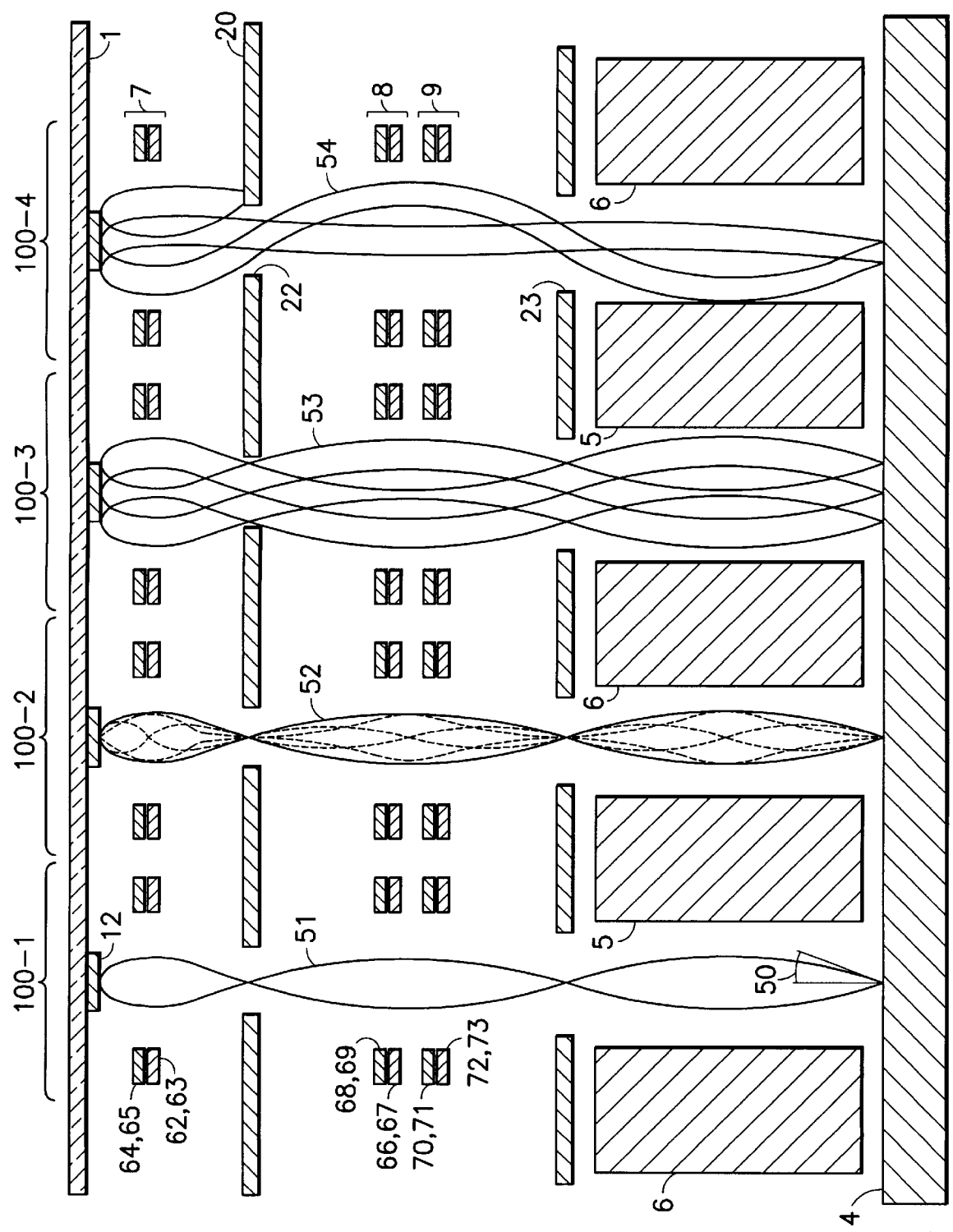
FIG. 2 illustrates in cross section several rows of the modules of FIG. 1.

Referring to FIG. 2, there is shown an array of modules 100-1 to 100-4, looking along the y-axis perpendicular to the plane of the paper. A set of four brackets at the top of the Figure define the position of the electron sources 12 and the area through which the beams travel. In principle, only one row of modules is required (100-1 and counterparts behind it). The other modules may be used if the range of deflection in the x-axis does not reach to the neighboring module or for redundancy to replace a defective module. The writing speed is proportional to the number of modules times the current in each module. The current in each module is limited by the available current density of the emitter. Therefore it is advantageous in practice to utilize as many modules as possible to maximize the writing speed. If the modules 100 are too close together, the electric fields employed for shaping and fine deflection will begin to overlap, causing unwanted crosstalk between beams. This practical consideration places a lower limit on the separation of modules at about 0.2 mm.

At the top of the figure, layer 1 forms a continuous flat, bulk substrate which supports the emitting layer 12. This composite, layered structure is composed of materials specific to the emitter technology used. The emitter must be amenable to patterning, must be capable of supplying the needed current density, on the order of 1.5 A/cm$^2$, must supply stable, uniform emission, and must be long-lived. A technology which has been proven to satisfy these requirements is the GaAs photocathode (J. E. Schneider, et. al., J. Vacuum Sci. Technol. B 14(6), 3782 (1996)). In this case the substrate 1 consists of glass, with deposited thin film layers consisting of GaAs and cesium oxide forming the emission area 12. The various electrodes are biased by a conventional power supply not shown in this figure for simplicity.

In between layer 1 and layer 20, there is a sandwich layer, denoted with bracket 7, containing the deflector electrodes 62–65. This is shown detail in FIGS. 3 and 4, and will be described later. Planar cathode substrate 1, shaping aperture array 20, and the shaping deflector array in layer 7 are all fabricated separately as planar, lithographically defined structures utilizing well established film deposition processes. They are each supported from their edges, and adjusted during assembly by shimming to insure that the elements are parallel to one another. Each element sags slightly under gravity, but the amount of sag, on the order of 0.1 micron, is negligible compared with the tolerances needed to properly set up the optics. Alignment of the three layers may be carried out using light for coarse alignment and then the electron beams for fine alignment. An advantageous feature of the invention is that the deflection systems can be set up during calibration to compensate for alignment errors.

The individual emitting surfaces are not separately addressed in the illustrative example, but are held at a common potential. Those skilled in the art will appreciate that a conventional criterion for uniformity is that the emitted current be uniform to ±1%, which is readily available with current technology, e.g. night vision devices.

An additional requirement on the cathode is that the transition between the (uniform) current in the beam and the non-emitting regions outside the beam be sufficiently sharp that the corresponding transition in the resist is within specifications. The exact requirement in any particular application will depend on the properties of the resist being used and the particular dimensional tolerance in question. A useful rule of thumb is that the width of the transition region should be less than 20% of the linewidth printed on the writing surface. For 100 nm written lines, this requires less than 20 nm edge acuity of the emitting region. This is within the capability of present day lithography to achieve.

Shaping aperture plate 20 is fabricated as a thin film stencil structure with square apertures (about 1 $\mu$m on a side) defined lithographically. Ideally the material and thickness should be chosen such that the beam does not penetrate through the material when it is directed onto the material. Many materials would work, but gold or platinum are preferred. These metals have high atomic number and high density, and consequently high stopping power for a given thickness. A foil of 2 microns thickness for 50 keV electrons will totally stop the beam, and, because of its thinness, can be patterned with square holes of high quality edge sharpness. This in turn produces a sharp image on the writing surface, required for printing fine lines of 100 nm width or smaller. The choice of gold or platinum has the further advantage that these materials do not form surface oxides which can charge up and deflect the beam unpredictably.

Alternatively, plate 20 may be a composite structure, with thicker ribs supporting a thin, patterned stencil film such as that illustrated in U.S. Pat. No. 5,466,904. The supporting ribs would have a larger aperture centered on aperture 22 to eliminate beam interference. It is not essential that the film totally stop the beam. It is adequate that the film scatter the beam without stopping or absorbing it. This approach would have the advantage that little or no energy is deposited in the film, thus eliminating dimensional change due to thermal expansion. The scattered current is then stopped by structures 8 and 9, thus preventing unwanted exposure on the target wafer by the scattered current. Again a wide choice of materials is available, but silicon is preferred for both the ribs and film, allowing standard patterning techniques to be used.

Deflection electrodes 5 and 6 continue in a direction perpendicular to the plane of the drawing in FIG. 2. A row of beams passes between pairs of neighboring electrodes. All electrodes 5 have the same variable potential applied, and all electrodes 6 have a variable potential which is always equal in magnitude and opposite in sign to electrodes 5. This results in a uniform transverse electric field, superimposed with the existing uniform axial magnetic field. This sweeps the focussed spot on wafer 4 perpendicular to the plane of the drawing across the area of a "subfield" that is swept out by the deflected beam as the stage moves the wafer underneath. All beams make the same angle with respect to the z-axis, so that the beams are parallel in both the upper and lower sections of the system. Adjacent rows of beams are deflected in opposite directions along the y-axis. In this way, adjacent beams within a given row remain equidistant, even in the presence of deflection. The deflectors 5 and 6 are repeated for neighboring rows of beams. This requires an array of parallel plates with thickness typically 0.5 mm and center-to-center spacing 1.0 mm, coinciding with the spacing of adjacent rows of beams. As these plates run the length of the beam array, the spacing can be precisely set by insulators at the ends of the plates. These insulators are located far enough from the beams that the accumulated surface charge does not cause unwanted deflection of the beams.

Each beam consists of many electron trajectories. Beams 51–54 schematically highlight specific trajectories, to illustrate details of the electron optical behavior. Beam 51 shows the beam envelope for a cone of rays emitted from a point in the center of emitter 12. In addition to the source 12, three crossovers occur at plates 20 and 21, and at wafer 4. At each of these three planes a sharply focussed image of the square emitter occurs. The angle 50 represents the numerical aperture (NA) of the system.

The numerical aperture, or NA, is defined in classical optics as the product of the index of refraction times the sine of the angle which the extreme ray makes with the optic axis, where these quantities are defined in the image space. The maximum ray angle is represented by the exit pupil, usually determined by a physical, beam limiting aperture. The importance of the NA derives from Abbe's theory of the diffraction limited resolution of microscopes. This theory shows that the resolution is inversely proportional to the NA.

This law applies to optical lithography systems, and to the present electron beam system as well. In the electron case the index of refraction is defined as the ratio of the electron momentum in the image space divided by that of the "virtual object" defined by extrapolating rays backward from the accelerating region. This ratio is equal to one here; therefore, the index of refraction is equal to one. For fast electrons the ray slopes are all much less than one; consequently, the NA is closely approximated by the slope of the extreme ray, measured at the image plane. This slope is equal to the maximum transverse velocity component divided by the average axial velocity component.

In the present system the NA is given to good approximation by the square root of the ratio of kT divided by eV, where k is Boltzmann's constant, T is the absolute temperature of the emitting surface, e is the electron charge, and V is the accelerating potential. In the preferred embodiment T=300 K, V=50,000 Volts, and NA=0.00071. The diffraction limited resolution, as defined by Abbe's theory, is given by 0.61 times the electron wavelength divided by the NA. The electron wavelength is 0.0055 nm, and the resulting resolution is 4.7 nm. This value is suitable for lithography down to 50 nm linewidths, appropriate to future generations of semiconductor devices.

This is accomplished without need of a physical beam defining aperture. This is of considerable practical importance, since a physical aperture, if present, would require exacting alignment tolerances on the order of 1 micron, in order to insure proper centering of the beam in the aperture. Such alignment tolerances are difficult to achieve in practice. Furthermore, those skilled in the art will appreciate that a physical aperture, if present, would collect contamination, which accumulates charge from interaction with the beam. This causes unwanted, unpredictable deflection of the beam, thus compromising placement accuracy.

Advantageously, the apertures in electrode arrays 7, 8, and 9 and in plate 23 are oversized with a nominal dimension of 30 $\mu$m to keep material well away from the beams. Since the source dimensions are about 1 $\mu$m and the imaging is 1:1, none of the apertures in the system serve as beam-limiting apertures in the usual sense of clipping a significant amount of the beam.

Beam 52 shows the same beam envelope as beam 51, but with the addition of individual electron trajectories shown as dotted lines. These trajectories spiral around the magnetic field axis, making one cyclotron orbit in the transverse plane between each pair of image planes. Conventional terminology is used herein, so that the beam is described as travelling parallel to the z-axis, etc. if the envelope of electron trajectories is parallel, even though the individual electrons do not travel in straight lines.

Beam 53 shows the extended source 12, consisting of many beam envelopes uniformly distributed over the emitter surface. Again three intermediate image planes are shown at plates 20 and 21, and at wafer 4, respectively.

Beam 54 shows the action of a voltage applied to shaping deflectors 7. The rightmost of the three bundles is stopped by plate 20, while the remainder of the beam passes through aperture 22. The axial positions of the image planes are undisturbed by this shaping action. Furthermore, the lateral position of the right hand edge of aperture 22 is similarly undisturbed. The shaped spot is smaller than the emitter 12, due to occluding of part of the beam.

Figure 3:
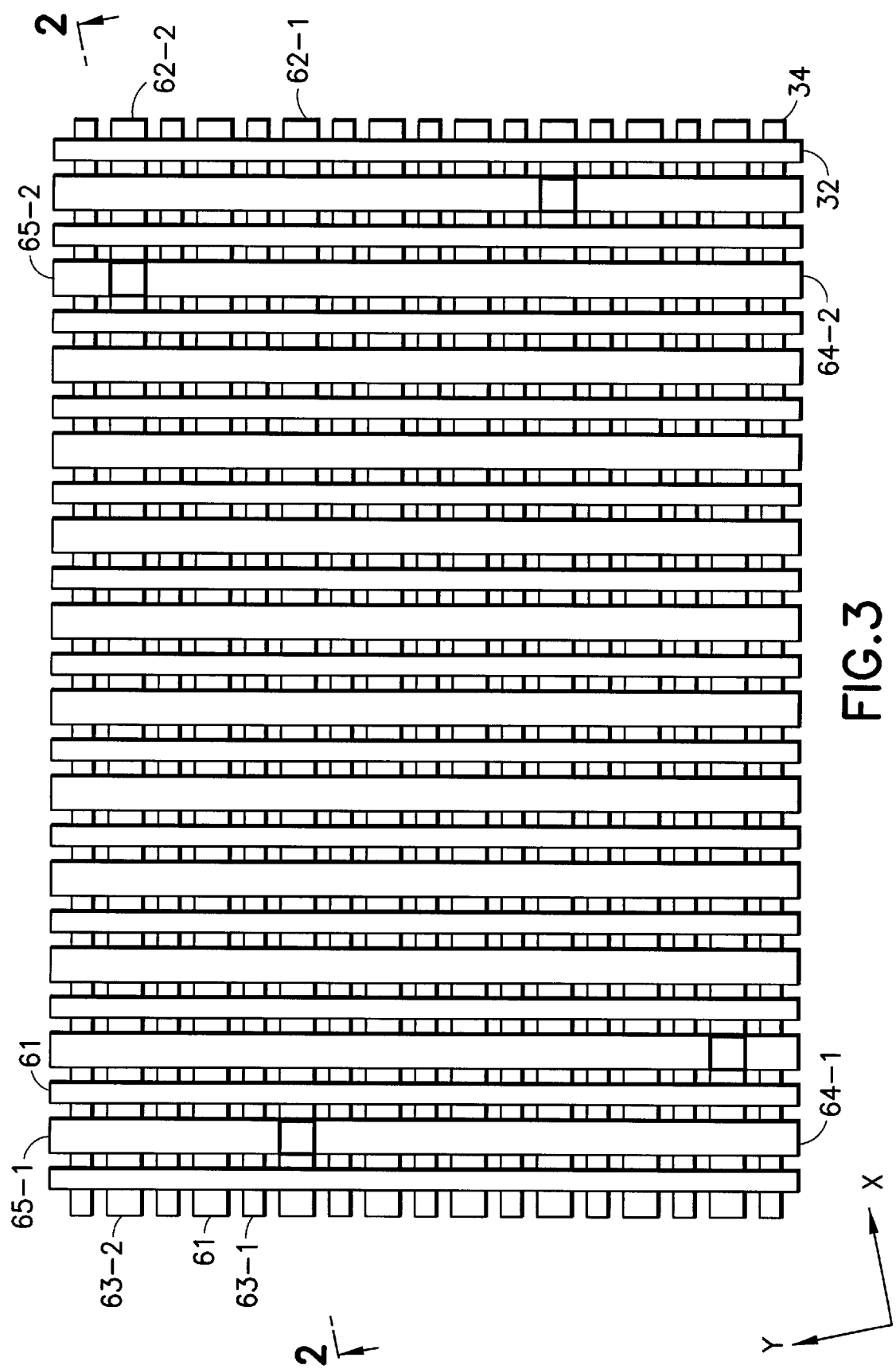
FIG. 3 illustrates a plan view of the deflection electrode layout.

Referring now to FIG. 3, there is shown a schematic top view of the wiring arrangement for the deflection assemblies 7, 8, and 9. The figure is not to scale, but is intended to convey the method of construction. Two separate layers are shown. The top layer (denoted with the numeral 32) consists of conducting lines running vertically in the figure. It contains the connectors (or connection members) for deflector electrodes 64 and 65 in FIG. 1. The bottom layer (denoted with numeral 34) consists of similar lines running horizontally in the figure and contains the connection members for electrodes 62 and 63 in FIG. 1. These layers are electrically isolated from one another by interposing insulating films 260, to be discussed later with respect to FIG. 4B. The arrows denoted 2—2 indicate the view of FIG. 2. The x and y-axes are aligned with the array of apertures, and are thus rotated with respect to the figure, as shown by the axes in the lower left of the figure. The individual square apertures in the deflector array are therefore rotated with respect to the x and y axes as shown in FIG. 3. This is of no consequence, since the emitters 12 and the images 25 are correctly aligned. Furthermore, by a suitable combination of deflection voltages in the two axes, deflection in any arbitrary direction is possible.

The aperture at the top left corresponds to the module on the left of FIG. 2. The four conductors which address this aperture are labelled 62-1 through 65-1, consistent with the diagram of a single module shown in FIG. 1. The conductor 62-1 enters from the right side, and terminates at the aperture. Similarly conductor 63-1 enters from the left side, 64-1 from the bottom, and 65-1 from the top. Each connection member supplies one and only one deflector electrode of one and only one aperture. In this way each beam is addressed independently, and all beams are addressed simultaneously, each with its own drive voltages. The various lines will be connected to a controller, not shown in this figure. This supplies the DC bias, together with the deflection signals at the correct time, in synchronism with the pattern data stream.

The aperture at the top right corresponds to the second module from the left in FIG. 2. It is wired similarly to the first module. The four conductors are labelled 62-2 through 65-2. It is evident that each conductor addresses one and only one deflector electrode separately for every beam in the figure, thus avoiding the use of crossovers, as would be required for a rectangular array. A rectangular deflector array could be used, if desired.

The deflector apertures are roughly 0.03 mm on a side, while the pitch is 1 mm in the x axis, and 0.25 mm in the y-axis. This leaves ample space to bring all conductors to the edges of the array. Positioned vertically between each pair of deflector leads is a conductor that is held at constant potential. This provides electrostatic shielding against stray fields that could deflect the beams in unwanted ways. The vertical space between conductors is roughly 5 $\mu$m. Conventional lithographic and thin film technologies are used to fabricate the multilayer deflector structure.

Deflector electrodes 62–65 will be referred to as lithographically defined electrodes, meaning that they are formed by a conventional lithographic process, e.g. depositing a blanket layer of aluminum above an insulating layer and etching the blanket layer to leave only the desired electrodes and connection members (and shielding electrodes 61 running parallel to the connection members). An insulator may then be deposited to fill the empty spaces left by the etching and form a planar surface for the next insulation layer. An example is aluminum for the conductors and polyimide, which is sufficiently fluid to fill the gaps and leave a substantially flat top surface. Boron-doped silicon dioxide, "reflow glass", may be used with a heat treatment to smooth out the top surface.

Figure 4B:
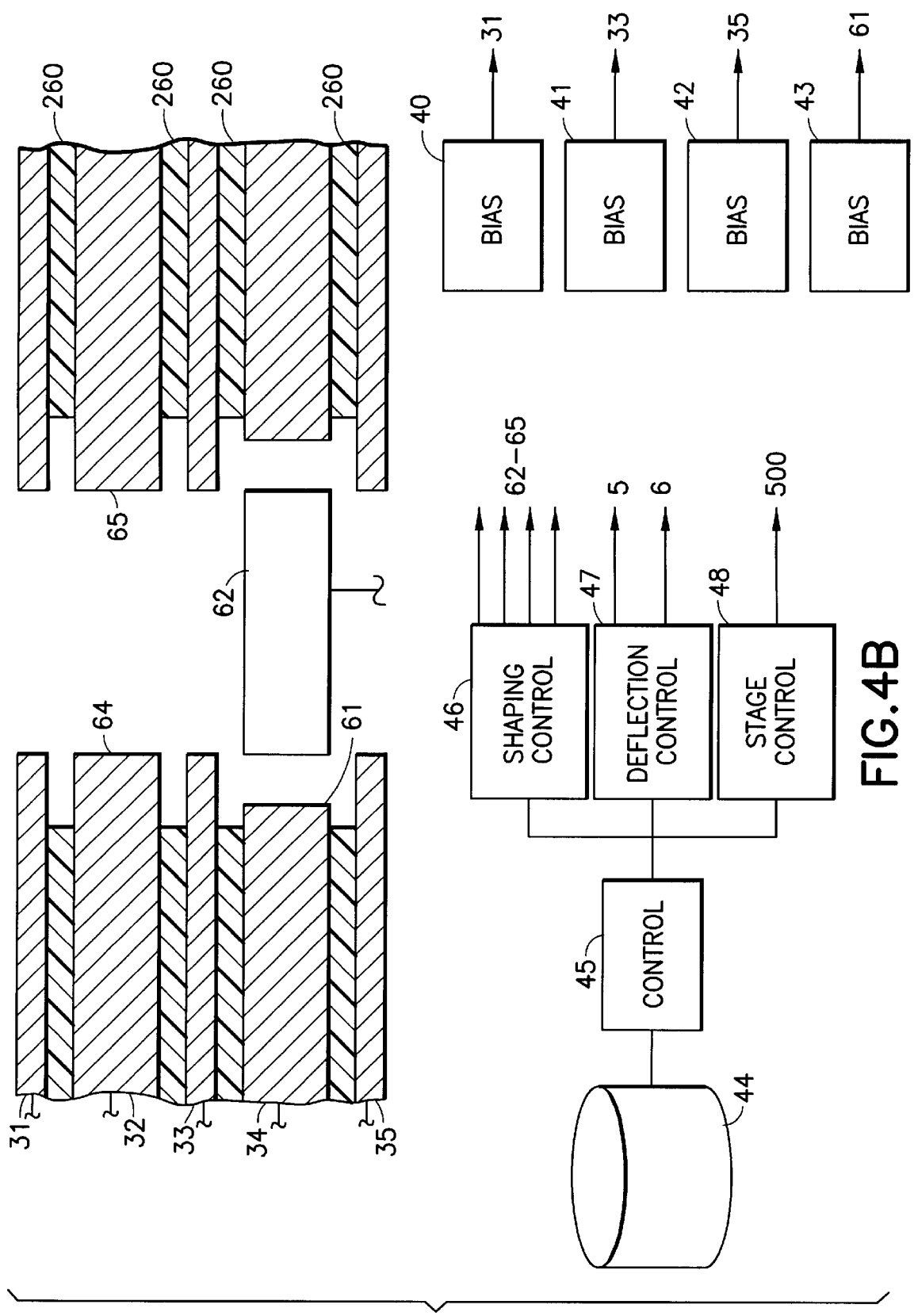
FIG. 4B illustrates a cross section of the beam shaping apertures and a schematic illustration of the control and bias supplies.

Referring now to FIGS. 4A and 4B, a cross section detail of one of the multilayer deflector structures 7, 8, and 9 is shown, as viewed looking toward a corner of one of the square apertures of FIG. 3. The sandwich consists of five conductive layers 31–35, all separated by insulating layers not shown in FIG. 4A. Layers 31, 33, and 35 are held at constant voltage, chosen to precisely maintain the uniform accelerating electrostatic field in the space between plates 1 and 20. Layers 32 and 34 are patterned lithographically to form the deflectors. The actual deflection electrodes consist of the exposed edges of the connection members, of which 62 and 65 are shown as examples. The deflection conductors 62 and 65 are interspersed with lithographically defined shielding electrodes 61 also shown in FIG. 3, that provide electrostatic isolation of each deflector from the other deflectors. Vertical extensions of insulating layers 260 or separately formed insulators separate the connection members and the shielding electrodes. The shielding electrodes 61 are held at a constant potential, also chosen to precisely maintain the uniform accelerating electric field in the space between plates 1 and 20.

FIG. 4B shows a section along the line 4B—4B in FIG. 4A, showing the insulating layers 260. Top conductor 31, separated by insulator 260 from layer 32 (containing electrodes 65-1 and 64-1), is biased by bias controller 40 (shown in FIG. 4C) at the appropriate DC level. Similarly, layer 33 is biased by supply 41, layer 35 by supply 42, and shield electrodes 61 (contained in layers 32 and 34) by supply 43. The voltages on electrodes 31, 33, 35, and 61 are constant, and do not depend on the pattern information to be written.

The supplies 40–43 are therefore independent and disconnected from the pattern electronics.

The pattern electronics are represented by boxes 44–48. Pattern storage 44, e.g. a disk drive, sends pattern data to pattern system controller 45. The system controller 45 is a general purpose computer with associated ancillary circuits which is designed and programmed to direct voltage signals to the various electrodes in synchronism with the pattern data stream. Shaping controller 46 derives the shaping voltage signals for plates 62–65. These signals are summed with the appropriate constant bias voltage, then directed to the shaping electrodes 62–65. Although only four leads are shown schematically in the figure, in actuality four leads are sent to each beam separately, utilizing the pattern of conductors depicted in FIG. 3. The number of leads is thus four times the number of beams. Any conventional connector, such as a ribbon conductor transmits the signals between controller 46 and shaping deflector 7.

Two additional controllers, represented schematically by control 46, supply signals to elements 7 and 8, respectively, for fine deflection and astigmatism correction. These two controllers behave in all respects similarly to controller 46.

Main deflection controller 47 supplies the deflection signal to plates 5 and 6, in synchronism with the pattern data stream. Although variable, the voltages on 5 and 6 remain equal and opposite at every instant. Only two leads are required from controller 47. All beams are deflected simultaneously in the y-axis by an amount proportional to the voltage, with neighboring rows of beams deflected opposite directions in y.

Figure 5:
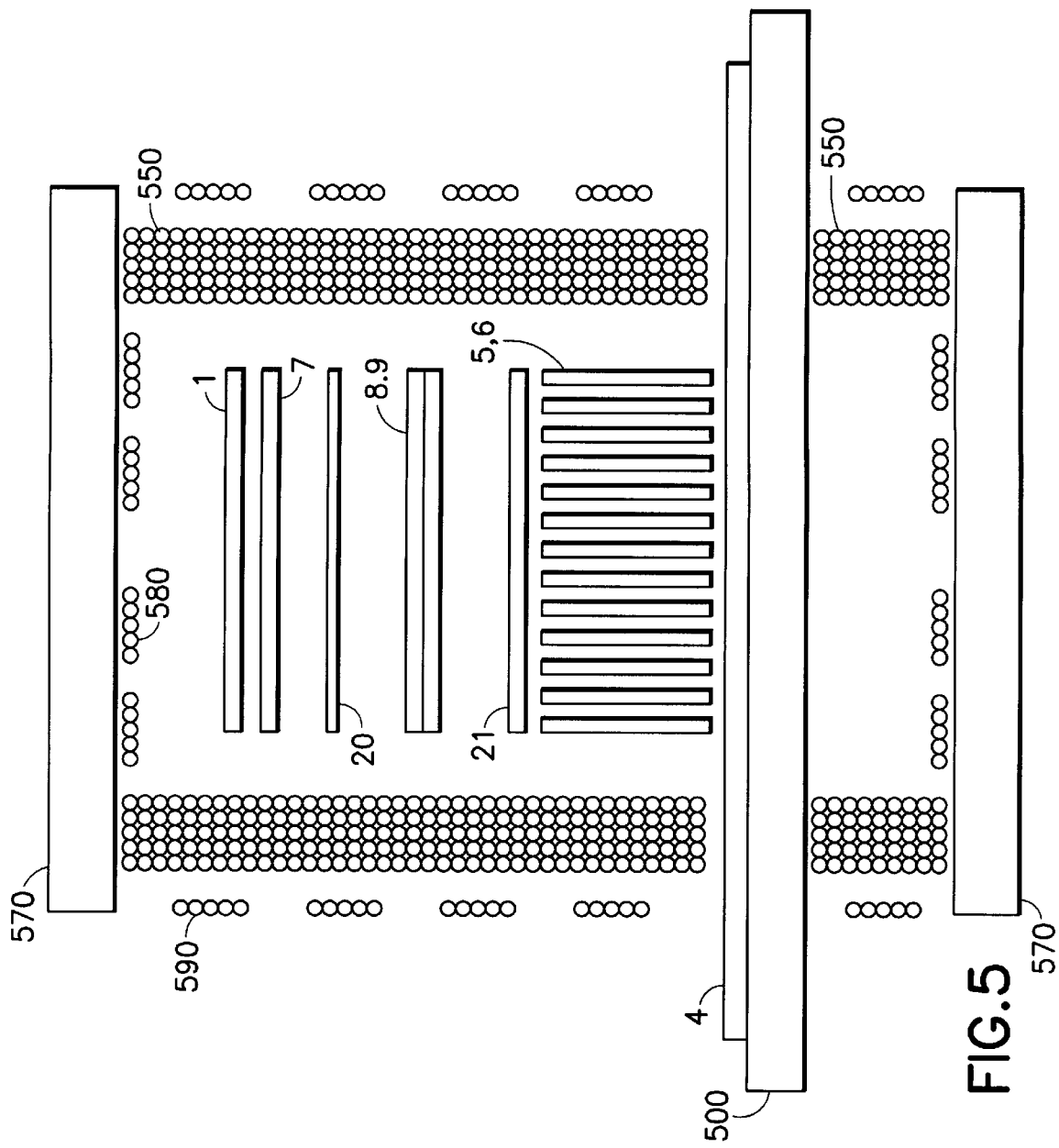
FIG. 5 illustrates a cross section of a system according to the invention.

Stage controller 48 receives position indicating signals from stage 500 in FIG. 5 and passes them back to system controller 45 to provide position feedback data. Preferably, position errors of the mechanical stage are corrected through a conventional feedback loop in which a laser interferometer senses the stage position. The difference between the measured and intended position comprises an error signal that is fed back to the deflectors 8 to correct the beam positions. The correction signal comprises a global correction fed equally to all beams and a local correction fed independently to each beam. Large errors in stage position are corrected by incorporating a variable delay in the writing time. Only when the stage is within a predetermined distance away from its intended position are the beams unblanked and writing.

The conductive layers 31–35 are formed from metal films deposited by sputtering, evaporation, electroplating or other conventional means, alternating with the insulating layers. The metal layers may consist of gold, platinum, or molybdenum, and the insulating layers may consist of silicon oxide or silicon nitride, for example, although other candidate materials exist as well. The insulating layers are etched back to a nominal recess distance of about 100 $\mu$m, so that no insulator is directly exposed to the beam. This prevents charging, which would otherwise deflect the beams in unwanted ways. Conventional wet etch or selective plasma etching can be used to recess the insulating layers.

The term "deflection composite structure" will be used to refer to the structure shown in FIGS. 4A and 4B, in which a first (lower) pair of lithographically defined deflector electrodes are the exposed edges of electrical connection members (e.g. 65-1, 64-1, 63-1, 62-1 in FIG. 3) formed by a lithographic process from a deposited layer firmly adhering to upper and lower insulating layers and to an in-plane insulating layer that separates the connection member from in-plane shielding electrodes (e.g. 61) that provide electrical shielding. A second or upper pair of lithographically defined deflector electrodes oriented at a right angle to the first pair has the same structure and is formed from layers deposited on the first set of layers. Bias electrode layers may be interspersed vertically in this structure, depending on the sensitivity to perturbations in the accelerating voltage distribution of the application being carried out.

Referring to FIG. 5, there is shown an overall schematic view of an embodiment of the invention, showing a solenoid 550 comprising a winding of wire turns on a hollow cylinder, the axis of which is oriented parallel with the beam axis 101. The entire apparatus is contained within the solenoid, thus ensuring the uniformity of the magnetic field. The solenoidal windings 550 extend above the stage 500 with wafer 4 clamped to it, and below the stage, ensuring uniformity of magnetic field at the writing surface.

Global uniformity of the magnetic field is ensured by enclosing the entire apparatus between two parallel polepieces 570 of high magnetic permeability, indicated schematically in FIG. 5. The polepieces are oriented perpendicular to the axes of the solenoid 550 and the beams. The polepieces have the added benefit of shielding the apparatus from unwanted stray magnetic fields which would otherwise deflect the electron beams in an uncontrolled manner.

An optional feature of the invention employs additional current windings at various places around the apparatus to ensure local uniformity of the magnetic field. Specifically, small trim coils 580 distributed around the inner surfaces of the magnetic polepieces, and excited independently, may be employed to adjust the magnetic field strength locally as a function of transverse coordinates. Additionally, windings 590 surrounding the entire apparatus, and distributed along the length of it (or a variation in the number of turns per unit length) may be employed to adjust the magnetic field strength as a function of the z coordinate. This, in turn, causes the focal strength to vary along the optical path, thus compensating for inaccuracies in the spacing of electrodes.

The extent of stage travel and the width of deflection are chosen such that neighboring subfields, as defined by neighboring beams, abut perfectly at all subfield boundaries. Small butting errors between subfields, may be corrected using a deflector array 8 identical in structure to the shaping deflector array 7, but with the differing purpose of causing each beam to move laterally and independently on the writing surface by a distance which is incremental compared with the spot size. Such an incremental deflection is accomplished by placing the deflector array 8 at an axial position that is roughly midway between plates 20 and 21.

Figure 6A:
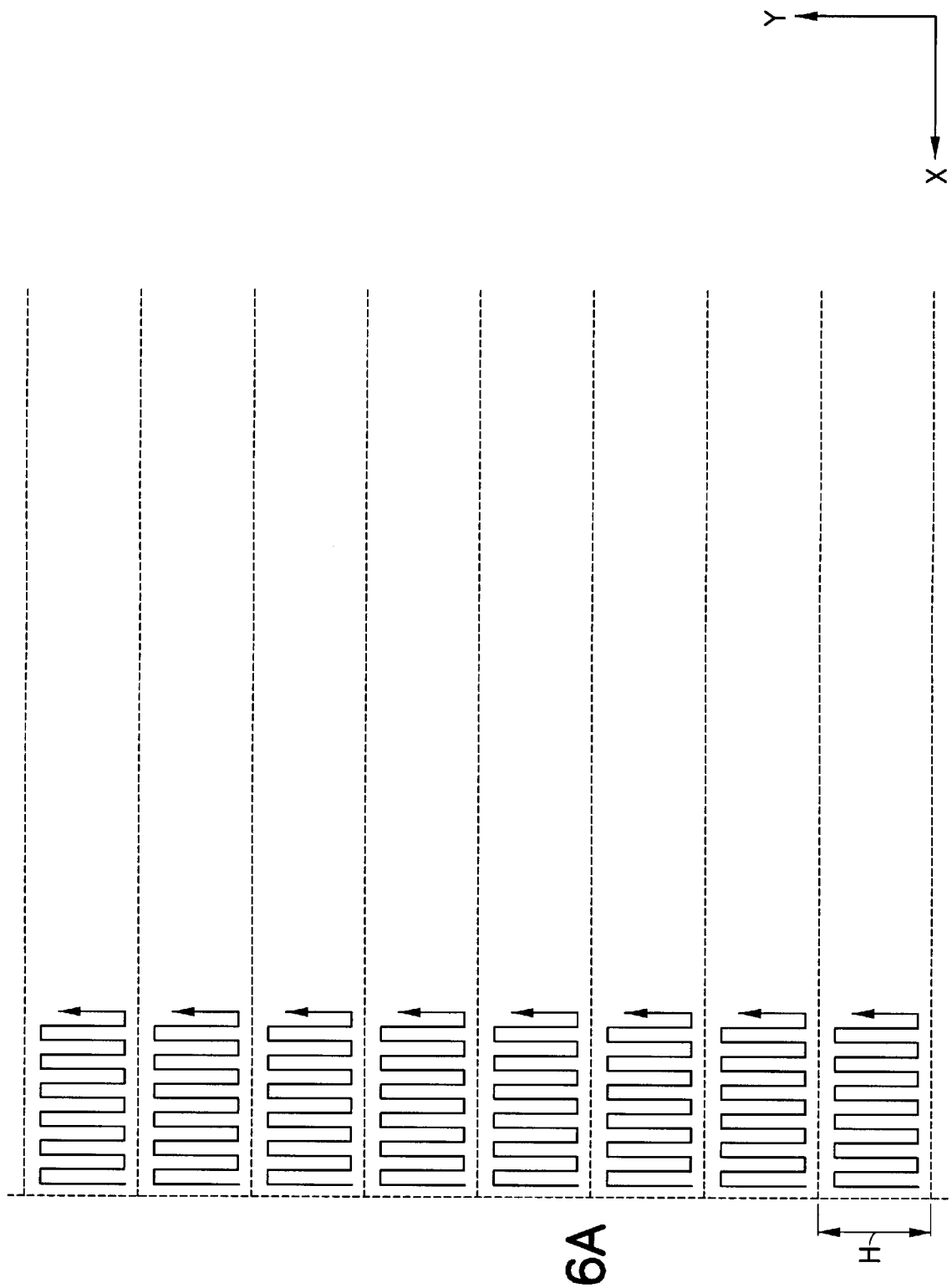

Two alternative methods exist for tiling the subfields to fill the entire pattern area. The first, called Wafer Mode, is shown in FIG. 6A. A row of beams extends across the entire writing surface. The beams are separated by a distance H in the y-axis. The deflection electrodes 5 and 6 are oriented parallel to the row of beams. According to the preceding analysis, the net beam deflection of each beam at the writing surface occurs in a direction parallel with the row of beams. The stage is caused to scan the entire length of the substrate in the x direction (which may be the length of a chip or the length of the whole wafer) in the direction perpendicular to the row of beams. Each subfield thus comprises a stripe of width H, typically 0.25 mm. The length of the stripe is equal to the length of the stage travel, in this case the length of the entire written wafer. The width of each subfield is equal to the width of the deflection, which is chosen to be greater than half the source interval between beam axes 101, so that neighboring subfields abut perfectly at their boundaries. The lines shown in the Figure represent the path of the center of the beam, which has a transverse extent such that proper overlap at the boundaries is realized. The serpentine patterns in FIG. 6A represent the paths traced out by the individual beams by the simultaneous and synchronized action of the stage motion 500 in the x direction, together with the deflection by plates 5 and 6 in the y direction. The individual beams are shaped in response to the pattern data stream as they make their transit across the wafer.

The second method, called Chip Mode, is shown in FIG. 6B. A rectangular array of beams covers a limited area of the writing surface corresponding to one chip width and chip length, typically 40 mm×40 mm. A first row 600-1–600-m and a second row 601-1–601-m are indicated. A row interval W is indicated at the upper right corner. The mechanical stage is caused to move precisely far enough in the x direction so that neighboring rows of beams abut perfectly at the subfield boundaries in the direction parallel with the stage travel (referred to as one row interval). The limited writing area is thus tiled with rectangular subfields, with length W (typically 1 mm) equal to the stage travel, and width H (typically 0.25 mm) equal to the deflection width. Thus, in this example, there will be 160 modules along the y-axis and 40 modules along the x-axis. After the area of one chip is exposed, the substrate is caused to move to the next writing area, by means of a relatively coarse two-axis motion. This latter motion is distinct from the fine motion utilized during the exposure, and can be controlled by separate, less exacting means as are used in commercially available steppers. The overall process is referred to as step and scan, using the same terminology as is used for photon optics.

An optical structure for correcting astigmatism independently for each beam is also shown in FIG. 1. The structure containing electrically addressable electrodes 66–73 of FIG. 1 is similar to deflector array 7, with the difference that the voltage applied to the four poles is a quadrupole configuration; i.e., plates 66 and 67 have identical, constant voltage, while a voltage is applied to 68 and 69 which is the same for these two plates, but equal and opposite to the voltage on 66 and 67. In this case no deflection of the beam occurs. Correction is applied to each beam independently. Two such planar devices are employed, with individual electrodes rotated 45 degrees in one relative to the other. Astigmatism in any y-axis is thus corrected by proper choice of plate voltages.

It may be desirable to demagnify each beam onto the writing surface, in which case several planar aperture arrays similar to apertures 22 at different potentials may be employed. One array, preferably the top one, is used to shape the beam and the others (e.g. composite layers 8 or 9 or layer 23) are used to accelerate or decelerate the electrons. A planar array of electrostatic lenses is thus formed, which focusses the individual beams without altering the relative positions of the beams. By this means the size of the rectangular spot on the writing surface is controlled. By demagnifying the individual spots, the sensitivity to defects or imperfections in the emitters or shaping apertures is reduced, resulting in improved lithographic quality in the exposed image.

It is also possible with the invention to simultaneously demagnify the spot size and relative positions of the individual beams by the same scale factor. In this case, solenoid 550 is wound with a varying number of turns per unit length along the z axis. This causes the magnetic field strength to vary with position along the axis which, in turn, causes the pattern formed by the array of beams to decrease in size by a uniform scale factor relative to the previous case where the winding density and magnetic field strength are uniform. The individual spots and the spacing between beams are demagnified by the same scale factor. This has the advantage that the emitting and shaping aperture arrays may be made larger than the final image at the writing surface. In this way defects in the emitter or shaping aperture arrays are demagnified, becoming less significant in the written image. The size of the demagnification factor depends on the gradient of the density of turns. Increasing the density of turns along the optical path causes the field strength to increase, in turn causing demagnification.

An optional method for averaging exposure errors consists of writing identical pattern features multiple times with the writing dose reduced by a factor equal to the number of rows that contribute. A given feature is written with a different beam for each exposure, with the result that small fluctuations in beam position and writing dose are averaged out. This is accomplished by either or both of two means. First, shown in FIG. 2, as the mechanical stage executes its normal motion, different beams in rows spaced along x-axis address any given pattern feature when the pattern feature passes under the applicable row. Second, the deflection subfields are made to overlap along the y-axis, so that different beams in the same row are caused to address any given pattern feature by virtue of the offset in deflected position.

Figure 6C:
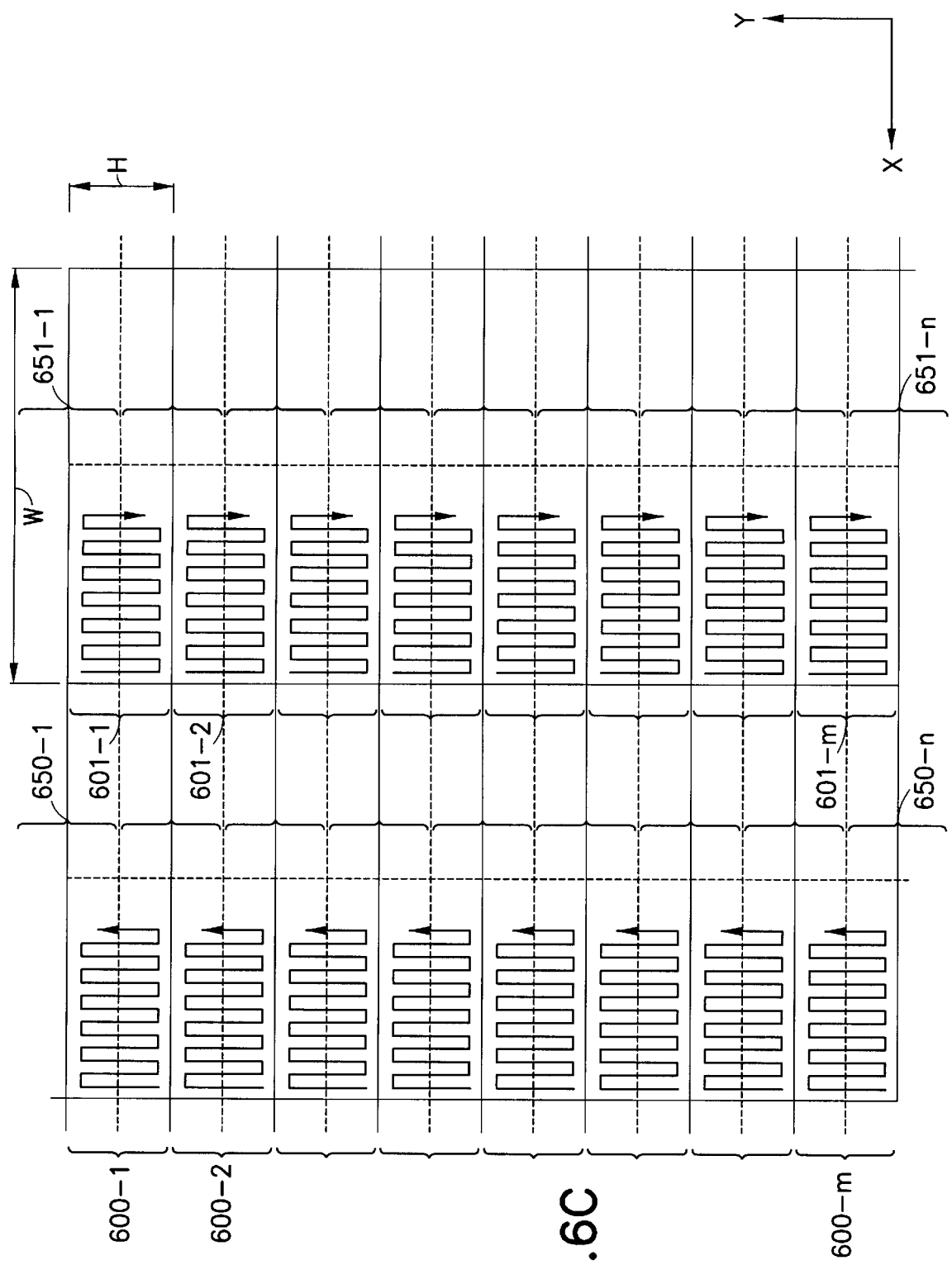

Each beam traces out a finite area, by virtue of the combined action of the deflectors 5 and 6 in the y direction, together with the motion of stage 500 in the x direction. It is essential that neighboring areas, defined by neighboring beams, meet at their boundaries, in order that no discontinuity of the written pattern features occurs at these boundaries. Butting of adjacent fields is termed "stitching" of the fields. In practice it is not possible to achieve perfect stitching, due to small errors in beam position relative to the intended position. This problem may be considerably reduced by writing the same area two or more times, with the field offset in position between the writing passes as is described above. In this way the total accumulated dose adds up to the needed dose appropriate to the resist used. This is depicted in FIG. 6C for two writing passes in Chip Mode. The solid lines represent the same field boundaries shown in FIG. 6B, written by the first row of modules, while the broken lines represent the field boundaries of a second writing pass done by a second row of modules, spatially offset along the y-axis midway between the positions of members of the first row. The array shown in FIG. 6B is denoted 600-1–600-m, 601-1–601-m, etc. The offset array is denote 650-1–650-n, 651-1–651-n, etc. While the field boundaries are offset with each pass, the position of a given pattern feature is not offset. This is equivalent to the pattern being offset within the field for each pass. A straightforward provision must be made in the pattern electronics for this to be properly done.

Although stitching errors exist at field boundaries for each individual writing pass, these errors are averaged out by the other passes, owing to the fact that the field boundaries are different. In general, the more writing passes employed, the better is the averaging, and the less apparent the stitching errors become. A similar procedure may be employed for Wafer Mode, in which the stripes are offset. This offset may be achieved either by offsetting the deflection voltage, or by offsetting the undeflected beam positions. This latter is achieved by departing from the strict rectilinear arrangement of beams described above, and interspersing beams at positions less than a full field apart.

Although the figures illustrate the case in which the deflection of a beam is greater than or equal to half the source interval between emitters, so that there is continuous coverage with a single row of emitters, it may be that it is preferable to have a deflection that is half, one third, etc. of the source interval. In that case, there will be a minimum of two, three, etc. rows to achieve continuous coverage. In such a case, there will need to be four, six, etc. rows to make use of averaging.

Another optional approach is that of varying the sensitivity of the various optical elements by varying the beam energy as a function of position along the beam axes. The optical elements in the aforementioned system, including cathode array, shaping aperture array, shaping deflector, fine position deflector, stigmator, and writing surface, consist of planar structures oriented perpendicular to the beam axes. By placing constant electrostatic potentials on successive elements, a resulting uniform electric field is produced which is oriented along the beam axes. The strength of the electrostatic field is given by the quotient of the potential difference divided by the spatial separation of neighboring optical elements along the beam axis. This change is employed to alter the kinetic energy of the beam along the optical path, while retaining the imaging properties. In general the kinetic energy of each beam at any given point is given by the potential difference between this point and the cathode surface, this difference being multiplied by the electronic charge.

It is useful to vary the kinetic energy along the flight path for several reasons. First, the emission properties of the cathode depend on the strength of the electric field at the emitting surface. Second, the sensitivity of electrostatic deflectors; i.e., the angular deflection for a given deflection plate voltage, is inversely proportional to the beam kinetic energy in the deflector. Third, the sensitivity of the electrostatic stigmators is inversely proportional to the beam kinetic energy. Fourth, the strength of the uniform magnetic focussing for given solenoid ampere-turns is inversely proportional to the beam kinetic energy. Fifth, the dose, measured in units of incident charge per unit area needed to expose the resist is inversely proportional to the beam kinetic energy at the writing surface. Sixth, the sensitivity to unwanted electromagnetic interference fields decreases as the beam kinetic energy increases. For these reasons it is desirable to vary the beam energy as a function of position along the flight path. This is accomplished by selecting the DC electrostatic potential of each planar element along the path (and adding elements as appropriate). The specific choice of potential for a given element depends on which of the above six functions it is desirable to affect. As a result, the beam may have variously higher or lower kinetic energy at differing points along the optical path.

An alignment method for measuring and correcting small, repeatable positional errors of the writing beams uses a test grid having a periodicity identical with the writing beams. This grid is permanently mounted on the stage, coplanar with the wafer writing surface. Some or all of the beams are caused to scan relative to the grid structure, by using global deflection in one transverse dimension, or stage motion in the orthogonal transverse dimension. During the scanning an electronic signal is extracted for each beam, simultaneously and independently, thus providing a measurement of the position of each beam relative to the grid structure. The difference between the position of each beam and the desired location on the ideal rectilinear array constitutes a position error in two transverse dimensions. This error is stored and is fed back to the fine position deflector for each beam, thus causing all beams independently to fall on the ideal rectilinear grid, thus improving the positional fidelity of the written pattern relative to its ideal, intended configuration.

Another optional method is suited for correction in real time of small, non-repeatable position errors of the writing beams. A pattern of reference marks is printed onto the writing surface prior to patterning. During the patterning operation, conventional detectors sense scattered electrons from the marks to generate an error signal for prompt correction of fluctuations in beam position.

While the invention has been described in terms of a single preferred embodiment, those skilled in the art will recognize that the invention can be practiced in various versions within the spirit and scope of the following claims.

We claim:

1. A direct-write e-beam system comprising:

means for establishing a substantially uniform magnetic field parallel to a z-axis, extending from a source plane perpendicular to said z-axis to a workpiece plane perpendicular to said z-axis;

an emitter array comprising at least one row of at least two electron emitting sources disposed in said source plane at an emitter location on said z-axis and at source locations separated by source intervals along a y-axis perpendicular to said z-axis, for generating at least one set of at least two electron beams directed along a set of at least two beam axes parallel to said z-axis toward said workpiece plane;

a shaping array of at least one row of at least two beam shaping apertures disposed in a beam shaping plane at a shaping location along said z-axis, said beam shaping apertures being disposed along said y-axis at said source intervals and aligned with corresponding sources in said emitter array;

first electric field means for generating a parallel electric field parallel to said z-axis and extending between said source plane and said beam shaping plane, said parallel electric field and said magnetic field having magnitudes related to one another and to said emitter location and said shaping location such that said set of parallel beams forms a set of images of said emitting sources at said beam shaping plane;

a beam shaping deflector array of at least one row of at least two deflector electrodes disposed in a beam shaping deflector region between said source plane and said beam shaping plane, with beam shaping apertures disposed along said y-axis at said source intervals and aligned with corresponding sources in said emitter array, said deflector electrodes of said beam shaping deflector array being electrically connected to a set of beam shaping deflector driver means for deflecting individual ones of said set of electron beams, whereby deflection of members of said set of electron beams with respect to corresponding beam shaping apertures forms an array of shaped beams;

a deflector array of at least one row of at least two parallel deflector electrodes disposed along said z-axis between said beam shaping plane and said workpiece plane, parallel to said y-axis and bracketing at least two of said set of electron beams in a first row of laid at least one row along an x-axis perpendicular to said y-axis and to said z-axis, second electric field means, electrically connected to said deflector array, for establishing a set of at least one deflection electric field parallel to said x-axis for deflecting said at least two of said set of electron beams in said first row in parallel within a deflection range along said y-axis, said deflection electric field and said magnetic field having magnitudes related to one another and to said shaping location and a workpiece location on said z-axis of said workpiece plane, such that said set of parallel beams forms a set of images of said emitting sources at said workpiece plane, said set of images intersecting said workpiece plane at substantially uniform image intervals along said y-axis, whereby all of said at least two of said set of electron beams travel in parallel paths, said parallel paths being parallel to said z-axis between said source plane and said beam shaping plane and said parallel paths having a common angle with respect to said z-axis between said beam shaping plane and said workpiece plane;

stage means for supporting and moving a workpiece under said set of electron beams; and system control means for controlling said set of electron beams in synchronism with said stage means to write in parallel a set of subfields on said workpiece.

2. A system according to claim 1, in which said emitter array, said shaping array and said beam shaping deflector array all have at least two rows of elements, said deflector array has at least three elements, and said system further includes means for disabling selected modules, whereby a defective module in one of said at least two rows may be replaced by a corresponding module in another of said at least two rows.

3. A system according to claim 2, in which said uniform magnetic field and said deflection electric field combine to establish a maximum deflection of said members of said set of electron beams that is greater than half said source interval, whereby said set of electron beams has a deflection range that is continuous.

4. A system according to claim 3, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

5. A system according to claim 1, in which said emitter array, said shaping array and said beam shaping deflector array all have at least two rows of elements that are aligned at said source locations and said deflector array has at least three elements, whereby corresponding modules in a second of said at least two rows may repeat a pattern written by a corresponding module in a first of said at least two rows, thereby averaging alignment errors.

6. A system according to claim 5, in which said beam shaping array of electrodes and said deflection electric field combine to establish a maximum deflection of said members of said set of electron beams that is greater than half said source interval, whereby said set of electron beams has a deflection range that is continuous.

7. A system according to claim 6, in which said emitter array, said shaping array and said beam shaping deflector array all have at least four rows of elements, two rows of which have members that are disposed along said y-axis midway between positions of members of said other two rows and said deflector array has at least five elements, whereby corresponding modules in two of said at least four rows may repeat a pattern written by a corresponding module in the other two of said at least four rows, thereby averaging alignment errors.

8. A system according to claim 5, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

9. A system according to claim 1, in which said beam shaping array of electrodes and said deflection electric field combine to establish a maximum deflection of said members of said set of electron beams that is greater than half said source interval, whereby said set of electron beams has a deflection range that is continuous.

10. A system according to claim 9, in which said emitter array, said shaping array and said beam shaping deflector array all have at least four rows of elements, two rows of which have members that are disposed along said y-axis midway between positions of members of said other two rows and said deflector array has at least five elements, whereby corresponding modules in two of said at least four rows may repeat a pattern written by a corresponding module in the other two of said at least four rows, thereby averaging alignment errors.

11. A system according to claim 1, in which said beam shaping array of electrodes comprises at least two sets of two pairs of electrodes, a first pair of which is disposed in a first plane along said z-axis along with a first pair of connection members disposed along a first direction in said first plane and a second pair of which is disposed in a second plane along said z-axis along with a second pair of connection members disposed along a second direction in said second plane, said first and second directions being at a right angle with respect to one another and said first direction being at an acute angle with respect to said x-axis and said second direction being at said acute angle with respect to said y-axis, said at least two sets of two pairs of electrodes being separated by a shaping separation distance related to said acute angle such that said beam shaping apertures are disposed along said y-axis at said source intervals and aligned with corresponding sources in said emitter array.

12. A system according to claim 11, in which said emitter array, said shaping array and said beam shaping deflector array all have at least two rows of elements, said deflector array has at least three elements, and said system further includes means for disabling selected modules, whereby a defective module in one of said at least two rows may be replaced by a corresponding module in another of said at least two rows.

13. A system according to claim 11, in which said emitter array, said shaping array and said beam shaping deflector array all have at least two rows of elements that are aligned at said source locations and said deflector array has at least three elements, whereby corresponding modules in a second of said at least two rows may repeat a pattern written by a corresponding module in a first of said at least two rows, thereby averaging alignment errors.

14. A system according to claim 13, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

15. A system according to claim 1 for writing a pattern for an integrated circuit chip having a chip width along said y-axis and a chip length along said x-axis, in which said at least one row of at least two electron emitting sources has a number of sources related to said source interval such that said set of subfields covers said chip width on said workpiece;

in which said at least two rows of at least two electron emitting sources has a number of rows related to said row interval separating two adjacent rows such that said set of subfields covers said chip length on said workpiece when said stage moves by one row interval; and said stage means and said system control means sequentially write a pattern of a plurality of chips in step and scan fashion.

16. A system according to claim 15, in which said emitter array, said shaping array and said beam shaping deflector array all have at least two rows of elements that are aligned at said source locations and said deflector array has at least three elements, whereby corresponding modules in a second of said at least two rows may repeat a pattern written by a corresponding module in a first of said at least two rows, thereby averaging alignment errors.

17. A system according to claim 16, in which said beam shaping array of electrodes and said deflection electric field combine to establish a maximum deflection of said members of said set of electron beams that is greater than half said source interval, whereby said set of electron beams has a deflection range that is continuous.

18. A system according to claim 17, in which said emitter array, said shaping array and said beam shaping deflector array all have at least four rows of elements, two rows of which have members that are disposed along said y-axis midway between positions of members of said other two rows and said deflector array has at least five elements, whereby corresponding modules in two of said at least four rows may repeat a pattern written by a corresponding module in the other two of said at least four rows, thereby averaging alignment errors.

19. A system according to claim 16, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

20. A system according to claim 19, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row.

21. A system according to claim 15, in which said beam shaping array of electrodes comprises at least two sets of two pairs of electrodes, a first pair of which is disposed in a first plane along said z-axis along with a first pair of connection members disposed along a first direction in said first plane and a second pair of which is disposed in a second plane along said z-axis along with a second pair of connection members disposed along a second direction in said second plane, said first and second directions being at a right angle with respect to one another and said first direction being at an acute angle with respect to said x-axis and said second direction being at said acute angle with respect to said y-axis, said at least two sets of two pairs of electrodes being separated by a shaping separation distance related to said acute angle such that said beam shaping apertures are disposed along said y-axis at said source intervals and aligned with corresponding sources in said emitter array.

22. A system according to claim 21, in which said emitter array, said shaping array and said beam shaping deflector array all have at least two rows of elements that are aligned at said source locations and said deflector array has at least three elements, whereby corresponding modules in a second of said at least two rows may repeat a pattern written by a corresponding module in a first of said at least two rows, thereby averaging alignment errors.

23. A system according to claim 22, in which said beam shaping array of electrodes and said deflection electric field combine to establish a maximum deflection of said members of said set of electron beams that is greater than half said source interval, whereby said set of electron beams has a deflection range that is continuous.

24. A system according to claim 23, in which said emitter array, said shaping array and said beam shaping deflector array all have at least four rows of elements, two rows of which have members that are disposed along said y-axis midway between positions of members of said other two rows and said deflector array has at least five elements, whereby corresponding modules in two of said at least four rows may repeat a pattern written by a corresponding module in the other two of said at least four rows, thereby averaging alignment errors.

25. A system according to claim 22, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

26. A system according to claim 25, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

27. A system according to claim 1 for writing a pattern for an integrated circuit wafer containing a plurality of integrated circuit chips, said wafer having a wafer width along said y-axis and a wafer length along said x-axis, in which said at least one row of at least two electron emitting sources has a number of sources related to said source interval such that said set of subfields covers said wafer width on said integrated circuit wafer; and in which said stage moves by a stage distance equal to said wafer length, whereby said entire wafer is written in a single pass.

28. A system according to claim 27, in which said emitter array, said shaping array and said beam shaping deflector array all have at least two rows of elements that are aligned at said source locations and said deflector array has at least three elements, whereby corresponding modules in a second of said at least two rows may repeat a pattern written by a corresponding module in a first of said at least two rows, thereby averaging alignment errors.

29. A system according to claim 28, in which said beam shaping array of electrodes and said deflection electric field combine to establish a maximum deflection of said members of said set of electron beams that is greater than half said source interval, whereby said set of electron beams has a deflection range that is continuous.

30. A system according to claim 29, in which said emitter array, said shaping array and said beam shaping deflector array all have at least four rows of elements, two rows of which have members that are disposed along said y-axis midway between positions of members of said other two rows and said deflector array has at least five elements, whereby corresponding modules in two of said at least four rows may repeat a pattern written by a corresponding module in the other two of said at least four rows, thereby averaging alignment errors.

31. A system according to claim 28, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

32. A system according to claim 27, in which said beam shaping array of electrodes comprises at least two sets of two pairs of electrodes, a first pair of which is disposed in a first plane along said z-axis along with a first pair of connection members disposed along a first direction in said first plane and a second pair of which is disposed in a second plane along said z-axis along with a second pair of connection members disposed along a second direction in said second plane, said first and second directions being at a right angle with respect to one another and said first direction being at an acute angle with respect to said x-axis and said second direction being at said acute angle with respect to said y-axis, said at least two sets of two pairs of electrodes being separated by a shaping separation distance related to said acute angle such that said beam shaping apertures are disposed along said y-axis at said source intervals and aligned with corresponding sources in said emitter array.

33. A system according to claim 32, in which said emitter array, said shaping array and said beam shaping deflector array all have at least two rows of elements that are aligned at said source locations and said deflector array has at least three elements, whereby corresponding modules in a second of said at least two rows may repeat a pattern written by a corresponding module in a first of said at least two rows, thereby averaging alignment errors.

34. A system according to claim 33, in which said beam shaping array of electrodes and said deflection electric field combine to establish a maximum deflection of said members of said set of electron beams that is greater than half said source interval, whereby said set of electron beams has a deflection range that is continuous.

35. A system according to claim 34, in which said emitter array, said shaping array and said beam shaping deflector array all have at least four rows of elements, two rows of which have members that are disposed along said y-axis midway between positions of members of said other two rows and said deflector array has at least five elements, whereby corresponding modules in two of said at least four rows may repeat a pattern written by a corresponding module in the other two of said at least four rows, thereby averaging alignment errors.

36. A system according to claim 33, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

37. A system according to claim 36, in which said uniform magnetic field and said deflection electric field combine to establish a maximum deflection of said members of said set of electron beams that is less than half said source interval, whereby said set of electron beams has a deflection range that is discontinuous, having a gap in coverage between adjacent beams in a first of said at least one row; and in which said emitter array, said shaping array and said beam shaping deflector array all have at least two rows of elements a second row of which has members that are disposed along said y-axis midway between positions of members of said first row and said deflector array has at least three elements, whereby elements of said second row fill said gap in coverage.

38. A system according to claim 1, in which said electron emitting sources each have a source transverse dimension, said set of images of said emitting sources at said beam shaping plane each have a image transverse dimension substantially equal to said source transverse dimension, and said beam shaping apertures each have a beam shaping transverse dimension substantially greater than said source transverse dimension, whereby a numerical aperture characteristic of said system is proportional to the ratio of the electron transverse velocity at said source plane to the axial electron velocity of said beam at said beam shaping plane and said numerical aperture is not defined by a beam limiting aperture.

* * * * *